(12) United States Patent
Matsuyama et al.

(10) Patent No.: US 10,215,996 B2
(45) Date of Patent: Feb. 26, 2019

(54) LIGHT SOURCE DEVICE

(71) Applicant: NICHIA CORPORATION, Anan-shi, Tokushima (JP)

(72) Inventors: Yuji Matsuyama, Tokushima (JP); Takashi Sakamoto, Anan (JP)

(73) Assignee: NICHIA CORPORATION, Anan-Shi (JP)

( * ) Notice: Subject to any disclaimer, the term of this patent is extended or adjusted under 35 U.S.C. 154(b) by 210 days.

(21) Appl. No.: 15/411,492

(22) Filed: Jan. 20, 2017

(65) Prior Publication Data

US 2017/0211776 A1 Jul. 27, 2017

(30) Foreign Application Priority Data

Jan. 21, 2016 (JP) .................................. 2016-009393

(51) Int. Cl.
*G02B 27/30* (2006.01)
*F21V 8/00* (2006.01)
(Continued)

(52) U.S. Cl.
CPC .............. *G02B 27/30* (2013.01); *F21S 41/14* (2018.01); *F21S 41/16* (2018.01); *F21S 41/19* (2018.01); *F21S 41/24* (2018.01); *F21S 41/285* (2018.01); *F21S 41/43* (2018.01); *F21S 41/657* (2018.01); *F21S 45/47* (2018.01); *G02B 6/0096* (2013.01);
(Continued)

(58) Field of Classification Search
CPC ....... G02B 27/30; G02B 6/0096; F21S 41/24; F21S 41/14; F21S 41/16; F21S 41/19; F21S 41/43; F21S 41/657; F21S 41/47; F21S 41/285; H01S 5/00; H01S 5/005; H01S 5/0071
See application file for complete search history.

(56) References Cited

U.S. PATENT DOCUMENTS 8,733,993 B2   5/2014   Takahashi et al.
2011/0248624 A1   10/2011   Kishimoto et al.
(Continued)

FOREIGN PATENT DOCUMENTS

JP   S55-017181 A   2/1980
JP   S55-018684 A   2/1980
(Continued)

*Primary Examiner* — Anabel Ton
(74) *Attorney, Agent, or Firm* — Foley & Lardner LLP

(57) ABSTRACT

A light source device includes a light source unit comprising a laser element configured to emit laser light, and a cap hermetically sealing the laser element; a wavelength conversion unit comprising a fluorescent material-containing member containing a fluorescent material adapted to be excited by the laser light; a light-shielding member having a pipe shape and having a first end with a first opening and a second end with a second opening, wherein the light-shielding member defines a hollow optical waveguide between the first end and the second end, the first opening at the first end is covered by the light source unit, and the wavelength conversion unit is arranged at the second end, thereby allowing the laser light propagating through the hollow optical waveguide to reach the fluorescent material-containing member; and an optical member configured to collimate the laser light and direct collimated laser light to the hollow optical waveguide.

19 Claims, 8 Drawing Sheets

(51) Int. Cl.
  *H01S 5/00* (2006.01)
  *F21S 41/19* (2018.01)
  *F21S 41/14* (2018.01)
  *F21S 41/20* (2018.01)
  *F21S 41/24* (2018.01)
  *F21S 41/43* (2018.01)
  *F21S 41/657* (2018.01)
  *F21S 45/47* (2018.01)
  *F21S 41/16* (2018.01)
  *F21S 45/50* (2018.01)
  *F21Y 115/30* (2016.01)
  *F21S 45/10* (2018.01)
  *H01S 5/022* (2006.01)

(52) U.S. Cl.
  CPC ............... *H01S 5/00* (2013.01); *H01S 5/005* (2013.01); *F21S 45/10* (2018.01); *F21S 45/50* (2018.01); *F21Y 2115/30* (2016.08); *H01S 5/0071* (2013.01); *H01S 5/02212* (2013.01)

(56) References Cited

U.S. PATENT DOCUMENTS

| | | | |
|---|---|---|---|
| 2011/0280039 A1* | 11/2011 | Kishimoto | B60Q 1/0011 362/554 |
| 2012/0106188 A1 | 5/2012 | Takahashi et al. | |
| 2013/0294049 A1* | 11/2013 | Finsterbusch | G02B 5/0215 362/84 |
| 2015/0372200 A1 | 12/2015 | Seko et al. | |
| 2016/0291232 A1* | 10/2016 | Hikmet | F21K 9/61 |

FOREIGN PATENT DOCUMENTS

| | | |
|---|---|---|
| JP | 2007-029653 A | 2/2007 |
| JP | 2011-233511 A | 11/2011 |
| JP | 2012-009380 A | 1/2012 |
| JP | 2012-109220 A | 6/2012 |
| JP | 2013-130835 A | 7/2013 |
| JP | 2013-187406 A | 9/2013 |
| JP | 2016-009693 A | 1/2016 |

\* cited by examiner

LIGHT SOURCE DEVICE

CROSS-REFERENCE TO RELATED PATENT APPLICATION

This application claims priority to Japanese Patent Application No. 2016-009393 filed on Jan. 21, 2016, the disclosure of which is hereby incorporated herein by reference in its entirety.

BACKGROUND

The present disclosure relates to a light source device.

Japanese unexamined patent application No. 2011-233511 describes a vehicular head lamp 90 having a configuration including a semiconductor laser 91, an optical fiber 92, and light-emitting part 93 including a fluorescent material, as shown in FIG. 12. Light of the semiconductor laser 91 passes through the optical fiber 92 and irradiates the light emitting part 93. The optical fiber 92 has a two-layer structure of a core and a cladding that covers the core, in which the cladding has a refractive index smaller than that of the core. The core is primarily made of quartz glass, and the cladding is primarily made of quartz glass or a synthetic resin with a refractive index smaller than that of the core.

SUMMARY

Semiconductor lasers and fluorescent materials both generate heat when they are in operation, and their performance is degraded with the rise in temperature. For this reason, when a semiconductor laser and a fluorescent material are disposed close to each other, either one of the semiconductor laser and the fluorescent material may affect the performance of the other. Thus, an optical fiber may be employed to increase the distance between the semiconductor laser and the fluorescent material to reduce adverse influence of heat generated by one of the semiconductor laser and the fluorescent material on the other. Also, the optical fiber can be in an appropriate bent shape, which allows installation of the semiconductor laser at any appropriate locations. In recent years, a vehicular head lamp tends to include an assembly of a plurality of types of light sources such as a light source for low beam, a light source for high beam, and a light source for daytime running lamp (DRL). In such cases, greater flexibility and diversity in the arrangement of the plurality of light sources can be provided with the use of an optical fiber.

Unfortunately, an optical fiber is generally a thin linear member. Thus, an optical fiber that employs a glass core is vulnerable to bending and easily broken. Meanwhile, an optical fiber made of plastic is more tolerant to bending than that made of glass, but is susceptible to laser light. Laser light used for vehicular head lamps is generally a high-power laser light of, for example, 1 W or greater, which may cause degradation of plastic optical fiber. Such light sources can be more desirable for in-vehicular application if those concerns described above are practically eliminated.

The embodiments include the aspects described below.

A light source device includes a light source unit, a wavelength conversion unit, a light-shielding member, and an optical member. The light source unit includes a laser element configured to emit laser light and a cap hermetically sealing the laser element. The wavelength conversion unit includes a fluorescent material-containing member containing a fluorescent material to be excited by the laser light. The light-shielding member has a pipe-shape having a first end with a first opening and a second end with a second opening, defining a hollow optical waveguide between the first end and the second end. The first opening at the first end is covered by the light source unit, and the wavelength conversion unit is arranged at the second end so that the laser light is allowed to propagate through the hollow optical waveguide to reach the fluorescent material-containing member. The optical member is configured to collimate the laser light and direct the collimated laser light to the hollow optical waveguide.

In the light source device as described above, the light source unit and the wavelength conversion unit can be arranged without the use of optical fiber so that heat generated from either the light source unit or the wavelength conversion unit does not adversely affect the other, while providing greater flexibility and diversity in the arrangement of the light source unit.

DETAILED DESCRIPTION OF EMBODIMENTS

Figure 1:
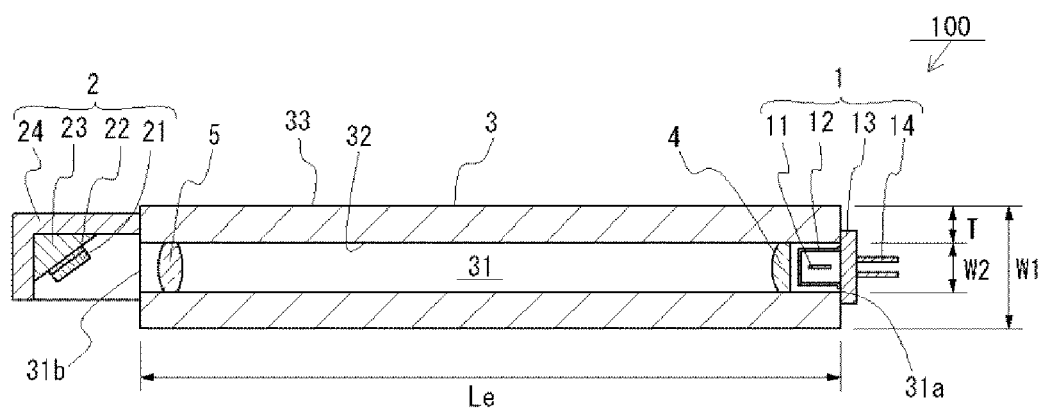
FIG. 1 is a schematic cross-sectional view of a light source device according to one embodiment.

Certain embodiments of the present invention will be described below with reference to the drawings. The embodiments shown below are intended as illustrative to give a concrete form to technical ideas of the present invention, and the scope of the invention is not limited to those described below. In the description below, the same designations or the same reference numerals denote the same or like members and duplicative descriptions will be appropriately omitted.

Figure 2:
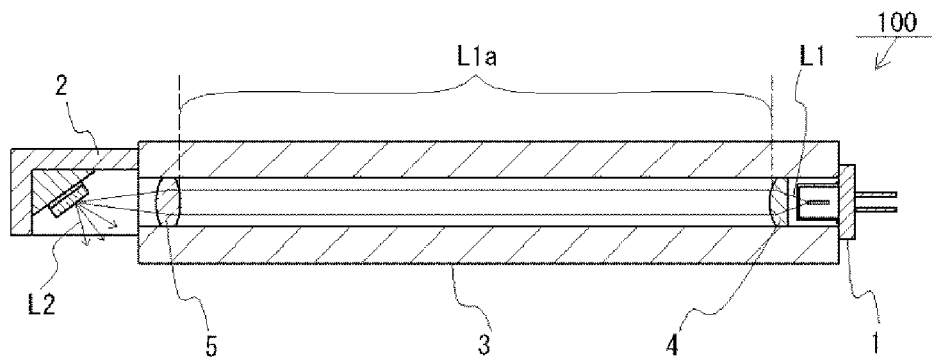
FIG. 2 is a diagram illustrating propagation of light in the light source device shown in FIG. 1.

FIG. 1 is a schematic cross-sectional view of a light source device 100 according to one embodiment. FIG. 2 is a diagram illustrating propagation of light in the light source device 100 shown in FIG. 1. As shown in FIG. 1 and FIG. 2, the light source device 100 includes a light source unit 1, a wavelength conversion unit 2, a pipe-shaped light-shielding member 3, and an optical member 4. The light source unit 1 includes a laser element 1 to emit laser light L1 and a cap 12 configured to hermetically seal the laser element 11. The wavelength conversion unit 2 includes a fluorescent material-containing member 21 containing a fluorescent material that can be excited by laser light L1. The light-shielding member 3 includes a hollow optical waveguide 31 having a first end 31a with a first opening and a second end 31b with a second opening. Further, in order to direct laser light L1 to propagate in the optical waveguide 31 to reach the fluorescent material-containing member 21, the first opening at the first end 31a is covered by the light source unit 1 and the wavelength conversion unit 2 is arranged at the second opening of the second end 31b. The optical member 4 is configured to collimate the laser light L1 and direct the laser light into the optical waveguide 31. In some drawings such as FIG. 2, collimated laser light (substantially parallel laser light) is shown as L1a to distinguish collimated laser light (substantially parallel laser light) from laser light with divergence.

In the light source device 100 having the configuration described above, laser light L1 advancing from the light source unit 1 to the wavelength conversion unit 2 is collimated (substantially parallel light L1a) to pass through the hollow optical waveguide 31, so that the light-shielding member 3 is not substantially irradiated with laser light L1. If a solid optical fiber is employed for the optical waveguide, the material of the core in that laser light passes through is needed to be selected based on difference in refractive index between the core and the clad that covers the core, and on the durability for laser light. However, in the light source device 100 according to the present embodiment, laser light L1 propagates through the hollow optical waveguide 31, so that the refractive index and the durability are not needed to consider when selecting the material of the light-shielding member 3. This allows the use of a mechanically strong material such as a metal pipe for the light-shielding member 3. In the present embodiment, the optical path of laser light L1 is surrounded by a light-shielding member 3 rather than by a transparent material in order to prevent laser light L1 from leaking to the outside.

The use of an optical fiber allows for reduction of adverse influence of heat generated by one of the semiconductor laser or the fluorescent material on the performance of the other, as described above, and for placement of the laser element at an appropriate location. These benefits can be attained in the light source device 100 according to the present embodiment. More specifically, the light source unit 1 and the wavelength conversion unit 2 are spaced apart from each other by the pipe-shaped light-shielding member 3, which allows heat from the light source unit 1 and heat from the wavelength conversion unit 2 can be released through separate paths. Thus, adverse influence of heat from either the laser element or the fluorescent material on performance of the other can be reduced. Also, the pipe-shaped light-shielding member 3 can be in any appropriate shape and length, allowing installation of the light source unit 1 to any appropriate location. As described above, the light source device 100 can exert similar effects that can be obtained with the use of an optical fiber, but without the need for an optical fiber.

One concern that may arise with the use of the hollow optical waveguide 31 is attracting dust. But in the light source device 100 according to the present embodiment, reduction in the attraction of dust is addressed by the configuration and arrangement of the light source unit 1. More specifically, in the light source device 100, the laser element 11 is hermetically sealed and the opening of the optical waveguide 31 proximate to the laser element 11 is covered by the light source unit 1. The higher the optical density, the more dust is attracted. Within the light source device 100, laser light L1 has a relatively small beam diameter at the laser element 11 and its vicinity. In other words, the laser element 11 and its vicinity has a relatively high optical density. Accordingly, first, the laser element 11 is hermetically sealed to reduce attracting of dust at the laser element 11 and its vicinity. Further, the first opening at the first end 31a of the optical waveguide 31 is covered by the light source unit 1. This is because the part of the light source unit 1 to emit laser light L1 tends to have a second highest optical density next to the laser element 11 and its vicinity, attracting of dust at this part is also needed to be reduced. That is, by covering the opening proximate to the light source unit 1, outside air can be hindered from flowing into the vicinity of the light source unit 1 located in the optical waveguide 31. If both of the two openings of the optical waveguide 31 are open, the optical waveguide 31 becomes an air passage, but this air passage can be eliminated by covering at least one of the openings of the optical waveguide 31 and outside air can be hindered from flowing into the optical waveguide 31. With a configuration that can hinder outside air from flowing into the part of the light source unit 1 to emit laser light L1 and its vicinity of the light source unit 1, entry of outside dust can also be reduced. Thus, reduction in attraction of dust at the part of the light source unit 1 to emit laser light L1 and its vicinity is thought to be achieved.

Each constituent member will be described in detail below.

Light Source Unit 1

Figure 3:
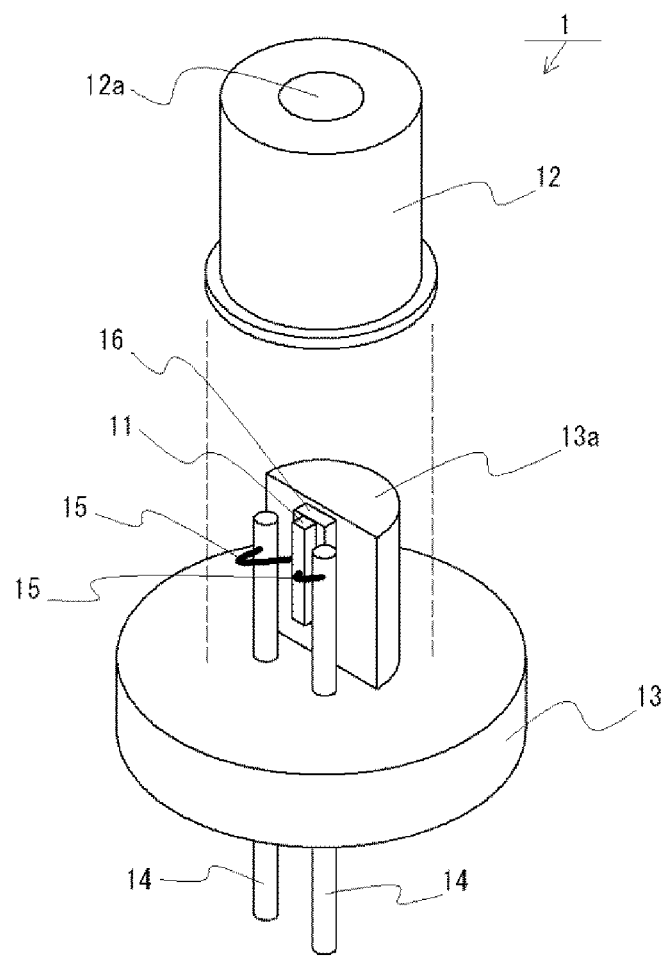
FIG. 3 is a schematic perspective view showing one example of a light source unit.

A light source unit 1 is configured to emit laser light L1. One example of the light source unit 1 is shown in FIG. 3. The light source unit 1 shown in FIG. 3 includes a cap 12 welded to join a base 13, creating a sealed space for hermetically sealing a laser element 11. Hermetically sealing the laser element 11 is thought to practically prevent damaging accumulation of dust attracted to the laser element. Accordingly, the airtightness of the joining of the light source unit 1 and the light-shielding member 3 may not be as high as the joining of the cap 12 and the base 13. Preferably, the light source unit 1 is detachably attached to the light-shielding member 3. Thus, when the laser element 11 ceases to emit light, the light source unit 1 can be replaced. Examples of methods of detachably attaching include fixing with a screw. With the use of a screw, secure fixing substantially without a positional error can be obtained while being detachably attached. The light source unit 1 and the light-shielding member 3 are not necessarily directly in contact with each other, and a bonding layer or the like may be arranged therebetween.

The cap 12 includes a light-transmissive window portion 12a through which laser light L1 of the laser element 11 to be extracted. The light source unit 1 is arranged so that the laser light L1 passing through the window 12a is guided in the optical waveguide 31. The optical path between the laser element 11 and the fluorescent material-containing member 21 is preferably free of any fluorescent material, so that the window 12a preferably does not contain a fluorescent material. This is because, since the laser light L1 has high directivity, it can pass the hollow optical waveguide 31 substantially without hitting the inner wall 32, but the directivity of the laser light that hits fluorescent material decreases and that decreases the probability of passing the hollow optical waveguide without hitting its inner wall 32. For a similar reason, it is preferable that the window 12a substantially does not contain a light scattering agent. The width of the cap may be smaller than the first opening of the first end 31a and the width of the base 13 may be greater than the first opening of the first end 31a. This arrangement allows for inserting the cap 12 into the optical waveguide 31 so that the first opening at the first end 31a can be covered by the base 13. In this case, the base 13 is fixed to the light-shielding member 3. Typically, the light source unit 1 is arranged so that the laser element 11 is located in the optical waveguide 31.

The light source unit 1 shown in FIG. 3 is an example of a CAN package. When a CAN package is employed, for example, through a sub-mount 16 or the like, the laser element 11 is provided on a lateral surface of a projection 13a projecting from a surface of the base 13 at the bonding surface with the cap 12. Two lead terminals 14 are provided penetrating the base 13, and one of the lead terminals serves as an anode and the other lead terminal serves as a cathode. The lead terminals 14 and the laser element 11 are electrically connected through conductive wires 15.

Laser Element 11

For the laser element 11, a semiconductor laser element such as a nitride-based semiconductor element can be employed. Such a nitride-based semiconductor laser element has a configuration of, for example, a substrate made of GaN or the like, and a plurality of layers, inclusive of an active layer made of InGaN or the like, provided on the substrate. The laser element 11 is configured to emit blue laser light L1, for example. More specifically, laser light L1 may have a peak wavelength in a range of 430 nm to 470 nm. Laser light L1 in such a wavelength band is suitable to excite YAG-based fluorescent materials. Combination of laser light L1 and the fluorescent material may be laser light of ultraviolet or purple light (for example, a peak wavelength of 415 nm or less) and fluorescent materials to emit light in the visible range (for example, three kinds of fluorescent materials to emit red, blue, and green light).

The light source unit 1 may have a plurality of laser elements 11. With this, higher output can be obtained than with a single laser element 11. For example, a plurality of laser elements 11 is arranged in an enclosed space defined by a single cap 12 and a single base 13. Alternatively, a plurality of laser packages each including one or more laser elements 11 arranged therein may be arranged in a single enclosed space. In this case, for example, the first end 31a side of the optical waveguide 31 is branched into the same number as the laser packaged and a single laser package is arranged at the end of each one of the branches.

Wavelength Conversion Unit 2

A wavelength conversion unit 2 includes a fluorescent material-containing member 21 configured to convert laser light L1 to light of a different wavelength. The fluorescent material-containing member 21 is, as shown in FIG. 1 and FIG. 2, preferably disposed to substantially completely cover the optical path of the laser light L1. With this configuration, coherence of the laser light L1 irradiated on the fluorescent material-containing member 21 can be reduced to obtain non-laser light having a same wavelength as that of the laser light L1. That is, by substantially completely covering the optical path of the laser light L1 by the fluorescent material-containing member 21, the possibility of the laser light L1 extracting to the outside from the light source device 100 can be reduced.

The light source device 100 can emit mixed light of light L2 whose wavelength is converted by the fluorescent material-containing member 21 and light having a wavelength the same as that of the laser light L1. The light source device 100 may emit substantially solely of wavelength converted light L2, but in view of efficiency, emission of light of mixed color is more practical in use. For example, blue laser light L1 is irradiated on a fluorescent material-containing member 21 that contains a yellow fluorescent material and/or an orange fluorescent material, and a mixed light of while light is extracted from the light source device 100.

As shown in FIG. 1, the wavelength conversion unit 2 may further include a light-reflecting member 22. The light-reflecting member 22 is configured to reflect laser light L1 and light L2 whose wavelength converted by the fluorescent material, and arranged on a side of the fluorescent material-containing member 21 opposite to the side where the laser light L1 is irradiated. With this configuration, part of the laser light L1 passing through the fluorescent material-containing member 21 is reflected at the light-reflecting member 22 and then extracted to the outside. This configuration provides plural occasions to reduce coherence of the laser light L1. One occasion is when the laser light enters the fluorescent material-containing member 21 and hits the fluorescent material before reaching the light-reflecting member 22, and one occasion is when the laser light reflected at the light-reflecting member 22 and hits the fluorescent material before exiting the fluorescent material-containing member 21. Accordingly, the laser light L1 is easily made into non-laser light between entering and exiting the fluorescent material-containing member 21, so that direct transmission of the laser light L1 from the fluorescent material-containing member 21 can be significantly avoided. Further, the surface of the fluorescent material-containing member 21 to which the laser light L1 is irradiated is also the surface from which the light is extracted, so that light of higher luminance can be obtained than that obtained from the configuration shown in FIG. 5 that to be described further below. The light-reflecting member 22 is preferably arranged on substantially the whole of one of the main surfaces of the fluorescent material-containing member 21. Also, the light-reflecting member 22 preferably has a reflectance of 60% or greater, more preferably 90% or greater with respect to the laser light L1. The light-reflecting member may have a metal layer such as an Ag layer or an Al layer, and also a dielectric multilayer film.

The wavelength conversion unit 2 may include a platform 23 and a case 24. For example, the platform 23 is fixed to the case 24, the light-reflecting member 22 is fixed to the platform 23, and the fluorescent material-containing member 21 is fixed to the light-reflecting member 22. Those members may not be in direct contact with each other and a bonding layer or the like may be provided between the members. The platform 23 and the case 24 also serve as heat-dissipating path to dissipate heat of the fluorescent material-containing member 21, so that the platform 23 and the case 24 are preferably made of materials that have a thermal conductivity greater than that of the fluorescent material-containing member 21. Accordingly, the heat of the fluorescent material-containing member 21 can be dissipated efficiently. Examples of such materials include aluminum, an aluminum alloy, copper, and a copper alloy. The platform 23 may be integrally formed with the case 24.

The wavelength conversion unit 2 is preferably firmly fixed to the light-shielding member 3 so that positional error is not substantially created. The wavelength conversion unit 2 may be removably attached to the light-shielding member, but the need of replacement of the wavelength conversion unit 2 is assumed lower compared to the light source unit 1. For this reason, the wavelength conversion unit 2 may be attached to the light-shielding member 3 so as not to be removal. For example, the wavelength conversion unit 2 can be fixed to the light-shielding member 3 by welding. The wavelength conversion unit 2 and the light-shielding member 3 may not directly in contact with each other, and a bonding layer or the like may be arranged therebetween.

Modified Example 1 of Wavelength Conversion Unit 2

Figure 4:
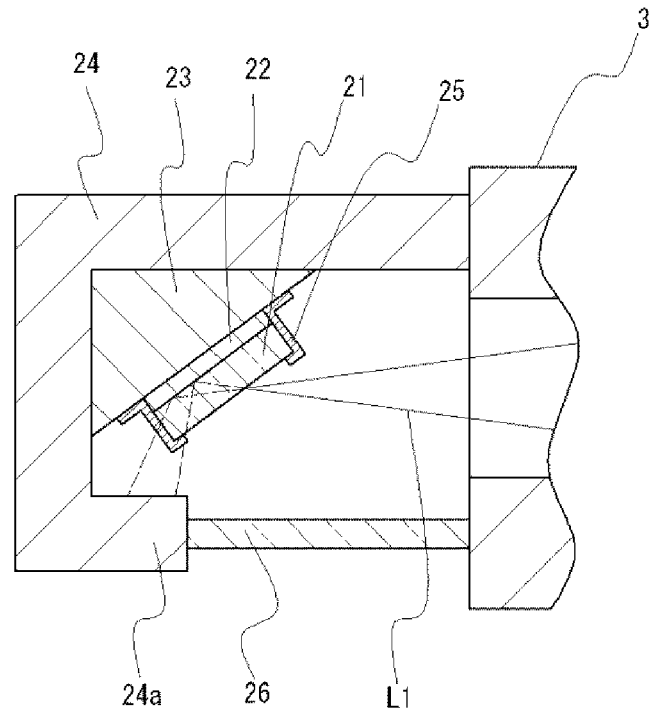
FIG. 4 is a schematic cross-sectional view illustrating Modified Example 1 of a wavelength conversion unit.

Modified Example 1 of the wavelength conversion unit 2 is shown in FIG. 4. As shown in FIG. 4, the wavelength conversion unit 2 may include a holder 25 so that the fluorescent material-containing member 21 is more securely firmly fixed. The holder 25 has a first end and a second end. The first end is fixed to the platform 23 and the second end is extended on a portion of the upper surface of the fluorescent material-containing member 21. Thus, even in the event of the fluorescent material-containing member 21 detaching from the light-reflecting member 22, the fluorescent material-containing member 21 can be held by the holder 25. The holder 25 is configured to hold a portion of the fluorescent material-containing member 21 except for the surface to be irradiated by the laser light L1. The wavelength conversion unit 2 may include a light-shielding portion 24a. The light-shielding portion 24a may be provided, as shown in FIG. 4, in an assumed optical path of the laser light L1 directly reflected at the light-reflecting member 22 so as to block the optical path. With this arrangement, even when the direct laser light is included in the light that has passed through the fluorescent material-containing member 21, the direct laser light is less likely to be extracted to the outside. In the FIG. 4, the light-shielding portion 24a is illustrates as a portion of the case 24, but the light-shielding portion 24a may be provided as a different member. The wavelength conversion unit 2 may include a cover 26 configured to seal the space including the fluorescent material-containing member 21. With this arrangement, attracting the dust to the wavelength conversion unit 2 can be reduced. The cover 26 is made of a light-transmissive member at least a portion for extracting light to the outside.

Modified Example 2 of Wavelength Conversion Unit 2

Figure 5:
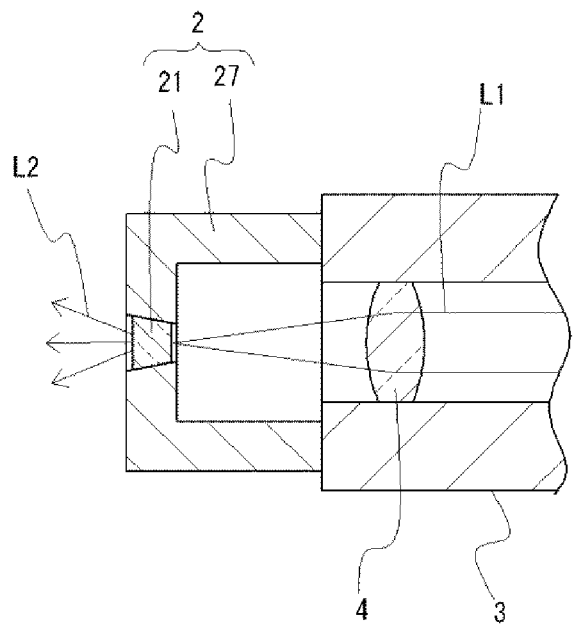
FIG. 5 is a schematic cross-sectional view illustrating Modified Example 2 of a wavelength conversion unit.

Modified Example 1 of the wavelength conversion unit 2 is shown in FIG. 5. FIG. 5 illustrates an example of configuration in which the light-reflecting member 22 is not provided. The wavelength conversion unit 2 shown in FIG. 5 includes a holding member 27 provided with a through-hole, and the fluorescent material-containing member 21 arranged in the through-hole. The fluorescent material-containing member 21 is arranged to substantially completely block the optical path of the laser light L1, so that light is extracted from the surface opposite to the surface irradiated by the laser light L1.

Fluorescent Material-Containing Member 21

The fluorescent material-containing member 21 includes a fluorescent material that can convert the wavelength of the laser light L1 to a different wavelength. By the fluorescent material-containing member 21, the wavelength of at least a portion of the laser light L1 is converted to a different wavelength. Examples of the fluorescent material include a YAG-based fluorescent material, a LAG-based fluorescent material, and a TAG-based fluorescent material. Two or more fluorescent materials may be contained in the fluorescent material-containing member 21. YAG-based fluorescent materials have greater durability to laser light than other fluorescent materials, and particularly suitable in the case where a high-output laser light L1 (for example, 1 W or greater) is employed.

The fluorescent material-containing member 21 may be singly made of a fluorescent material, but may be made of a fluorescent material and a holding material configured to sustain the fluorescent material. The holding material is preferably an inorganic material. Accordingly, degradation, discoloration, or the like, of the holding material caused by the laser light L1 can be reduced. Examples of the inorganic material include $Al_2O_3$ and $Y_2O_3$.

Light-Shielding Member 3

The light-shielding member 3 is a pipe-shape member, the hollow interior provides an optical waveguide 31 to allow the laser light L1 to pass through. As described above, the use of the light-shielding member 3 is thought to contribute to advantageous performance as that obtained by the use of an optical fiber, without using an optical fiber. Accordingly, an optical fiber is not needed for the path of the laser light L1 in the light source device 100. More specifically, an optical fiber is not present in the optical path of the laser light L1 from the laser element 11 to the fluorescent material-containing member 21. Accordingly, the concerns in using the optical fiber as described above can be eliminated. In the present specification, the term "optical fiber" refers to a solid optical fiber, which is an optical fiber having a core made of certain member such as glass.

The inner wall 32 of the light-shielding member 3 that defines the optical waveguide 31 is preferably substantially not to be irradiated with the laser light L1 inclusive of collimated light L1a. Therefore, the light-shielding member 3, the light source unit 1, and the optical member 4 are preferably arranged to satisfy such a locational relationship. With such an arrangement, possibility of the light-shielding member 3 being degraded by the laser light L1 can be reduced.

In order to prevent the laser light L1 from hitting the inner wall 32 of the light-shielding member 3, the greater the deviation of the propagating direction of the laser light L1 from the extending direction of the optical waveguide 31, the greater the need to increase the width W2 of the optical waveguide 31. In other words, reduction in the deviation in the propagating direction of the laser light L1 can reduce a need for increasing the width W2 of the optical waveguide 31, which can reduce a need for increasing the width W1 of the light-shielding member 3. Accordingly, each of the members is preferably arranged so that the propagating direction of the laser light L1 and the extending direction of the optical waveguide 31 are approximately coincide with each other. If the light-shielding member 3 of a small width can be used, greater flexibility and diversity are allowed in the arrangement of a plurality of light sources such as in vehicular head lamps. For example, 20 mm or less can be employed for the width W1 of light-shielding member 3. In the specification, the term "width" indicates a greatest length substantially perpendicular to the extending direction of the optical waveguide 31. For example, if the light-shielding member 3 has a cylindrical shape, the diameter of the cylindrical shape corresponds to the width W1. The smallest width W1 may be configured so that the inner wall 32 does not interrupt propagation of the laser light L1. For example, the width W1 may be 5 mm or greater. In order to secure a sufficient wall thickness T of the light-shielding member 3, the width W1 may be, for example, 12 mm or greater.

If the light-shielding member 3 is deformed, the inner wall 32 may inwardly protrude to block the optical path of the laser light L1. In order to avoid such deformation, the light-shielding member 3 preferably sufficiently hard so that the shape of the optical waveguide 31 does not substantially change. In other words, the degree of deformation of the light-shielding member 3 under operation of the light source device 100 is preferably such that the optical path of the laser light L1 is not blocked by the inner wall 32. For example, the light-shielding member 3 is primarily made of a metal. The light-shielding member 3 is, for example, made of a metal pipe or a plastic pipe. Also, the wall of the light-shielding member 3 has a thickness T of, for example, preferably 1 mm or greater, more preferably 5 mm or greater. The greater the thickness T of the light-shielding member 3, the less deformation occurred by external force. Meanwhile, in order to avoid increasing the width W1 of the light-shielding member 3, the thickness T of the wall may be 9 mm or less. Also, if the positional relationship of the light-shielding member 3, the light source unit 1, and the optical member 4 is misaligned, the laser light L1 may propagate in an unintended direction and may hit the inner wall 32. In order to avoid the laser light L1 from hitting the inner wall, the light source unit 1 and the optical member 4 are preferably respectively fixed to the light-shielding member 3. For example, the fixing can be obtained with the use of a screw or by welding, or by indirect fixing via a bonding layer or the like.

The light-shielding member 3 has a pipe shape, that is, has a long and narrow shape. That is, the light-shielding member 3 has a length that is greater than its width W1. The light-shielding member 3 has a cross-sectional outline of, for example, an approximately circular shape, an approximately elliptic shape, an approximately rectangular shape, or the like. In the present specification, the expression "outline of cross-sectional shape of the light-shielding member 3" refers to a shape of an outer wall 33 in a cross section approximately perpendicular to the extending direction of the optical waveguide 31. As will be described below, when a portion of the light-shielding member 3 is formed rotatably (FIG. 6, FIG. 9), an approximately circular outline of the cross-sectional shape of the light-shielding member 3 can be preferable for facilitating the rotation. The thickness T of the light-shielding member 3 is, for example, substantially constant from the first end 31a to the second end 31b. The outline of the cross-sectional shape of the light-shielding member 3 may be substantially same as the cross-sectional shape of the optical waveguide 31.

Modified Example 1 of Light-Shielding Member 3

Figure 6:
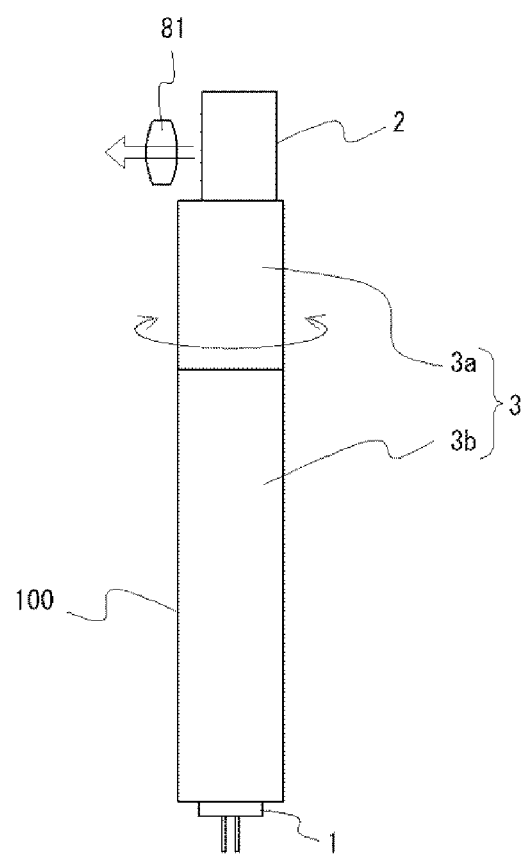
FIG. 6 is a schematic cross-sectional view illustrating Modified Example 1 of a light-shielding member.

Modified Example 1 of the light-shielding member 3 is shown in FIG. 6. The light-shielding member 3 shown in FIG. 6 includes a tip part 3a inclusive of the second tip 31b and a supporting part 3b to which the tip part 3a is rotatably attached. With the rotatable tip part 3a, the light source device can be applied, for example, to vehicular head lamps of adaptive front-lighting system (AFS) that are configured to change the irradiation direction according to the travelling direction of the vehicles. The rotating axis of the tip part 3a is, for example, approximately aligned with the propagation direction of the laser light L1 at the joint portion of the tip part 3a and the supporting part 3b.

The inner wall 32 at the joint portion of the tip part 3a and the supporting part 3b and its vicinity tends to have a step-portion. If the light source device is configured to reflect laser light by using the inner wall as a reflecting surface, the laser light may be reflected at the step-portion into unintended direction, which may result in optical loss. However, when the light source device is configured so that the laser light L1 is not irradiated on the inner wall 32 of the optical waveguide 31, as described above, such optical loss due to unintentional reflection is not likely occur. The thickness T of the light-shielding member 3 can be partially changed so that the tip part 3a and the supporting part 3b can be engaged at the joint portion. Further, the light source device 100 can be used, for example, in combination of an external lens 81 such as a collecting lens. The white arrow in FIG. 6 indicates an approximate direction of light that is emitted from the light source device 100.

Modified Example 2 of Light-Shielding Member 3

Figure 7:
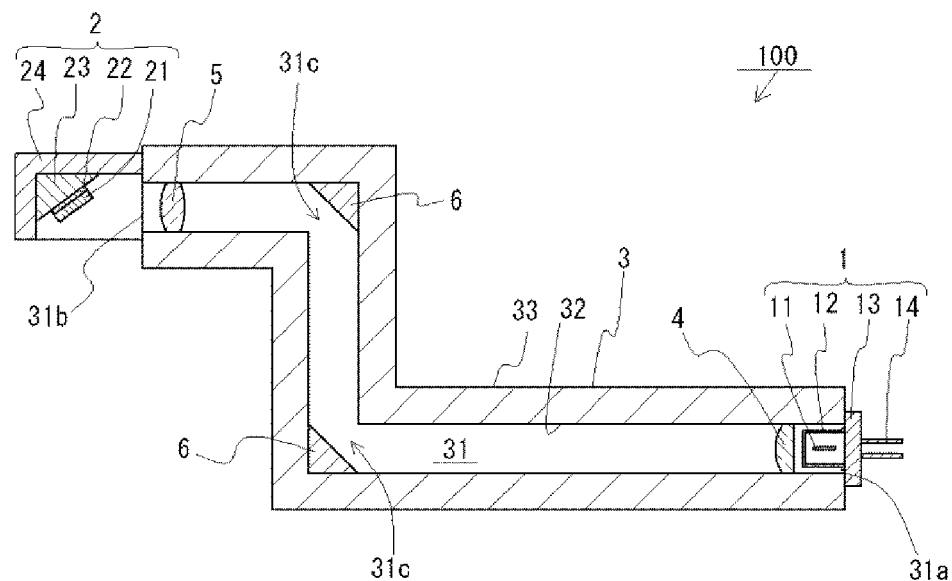
FIG. 7 is a schematic cross-sectional view illustrating Modified Example 2 of a light-shielding member.
Figure 8:
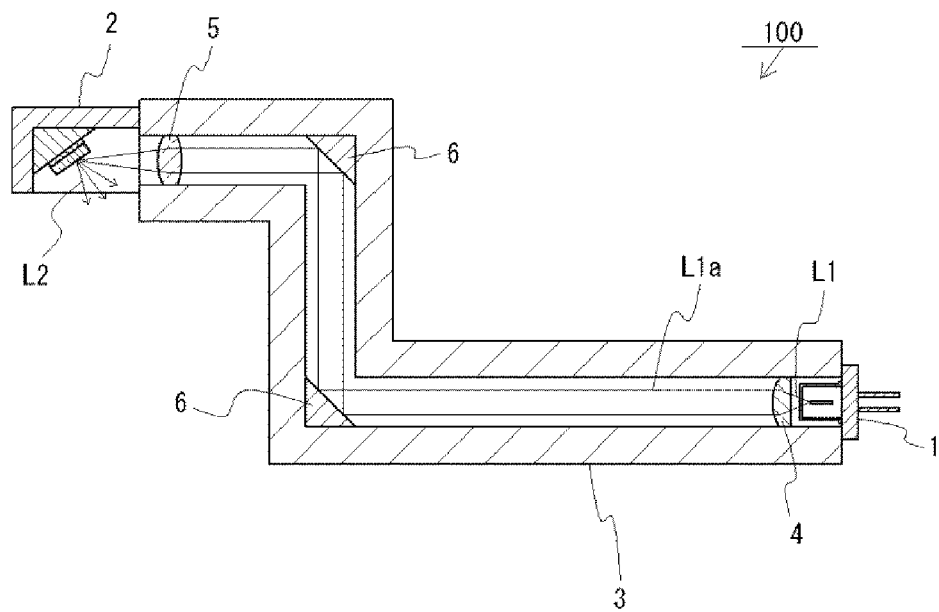
FIG. 8 is a diagram illustrating propagation of light in the light source device shown in FIG. 7.

Modified Example 2 of the light-shielding member 3 is shown in FIG. 7 and FIG. 8. FIG. 8 is a diagram illustrating propagation of light in the light source device 100 shown in FIG. 7. In the light-shielding member 3 shown in FIG. 7 and FIG. 8, the optical waveguide 31 has one or more bent portions 31c. A mirror 6 is provided at each bent portion 31c so as to change the direction of the laser light L1 in a direction along the shape of the optical waveguide 31. Accordingly, the light-shielding member 3 can be arranged avoiding other light source modules or the like. The number, location, angle of bent of the bent portion 31c may be adjusted according to the location to install the light source device 100.

The mirror 6 is configured to reflect the laser light L1 so that the laser light L1 does not hit the inner wall 32. For example, as shown in FIG. 7 and FIG. 8, to a bent portion 31c that is bent approximately perpendicularly, a mirror 6 having a reflecting surface at an angle of 45° with respect to the propagating direction of the laser light L1 is arranged. The mirror 6 may be formed with a material different from that of the light-shielding member 3. For example, a glass having a metal film containing aluminum on its surface, a reflecting member made of a dielectric film, or a reflection-enhancing mirror may be used for the mirror 6.

Modified Example 3 of Light-Shielding Member 3

Figure 9:
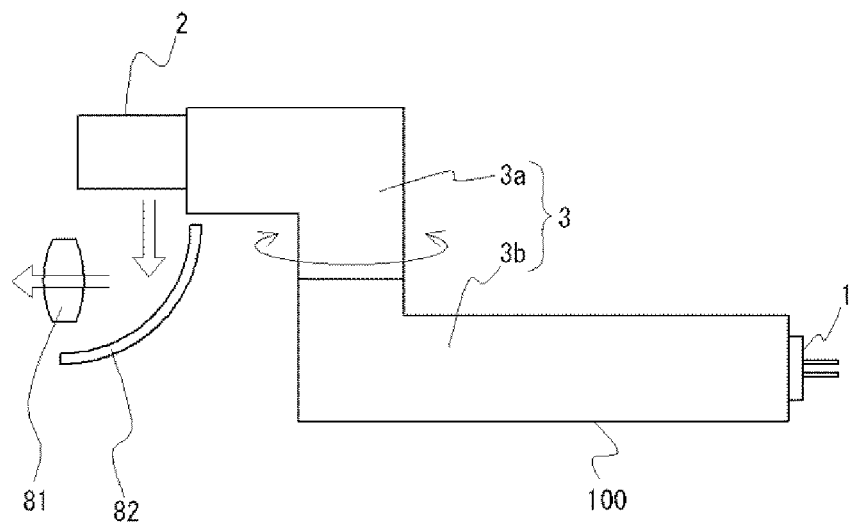
FIG. 9 is a schematic cross-sectional view illustrating Modified Example 3 of a light-shielding member.

Modified Example 3 of the light-shielding member 3 is shown in FIG. 9. In Modified Example 3, a light-shielding member 3 having a shape as in Modified Example 2 is formed partially roratably as in Modified Example 1. That is, the light-shielding member 3 shown in FIG. 9 includes a tip part 3a inclusive of the second tip 31b and a supporting part 3b to which the tip part 3a is rotatably attached. Since the tip 3a is rotatable, the light source device can be applied to vehicular head lamps of AFS, for example. The rotating axis of the tip part 3a may be approximately aligned with the propagation direction of the laser light L1 at the joint portion of the tip part 3a and the supporting part 3b. The tip part 3a may include one or more bent portions. Further, the light source device 100 can be used, for example, in combination of an external reflector 82 and/or an external lens 81 such as a collecting lens. The white arrow in FIG. 9 indicates an approximate direction of light that is emitted from the light source device 100.

Optical Waveguide 31

The optical waveguide 31 is hollow. In other words, the optical waveguide 31 is a space willed with a gas. The optical waveguide 31 may be filled with a specified atmosphere, but hermetical sealing is required to maintain the specific atmosphere. When a joining method for hermetically sealing is applied, replacement of the light source unit 1 or the like becomes difficult, so that the optical waveguide 31 may not be hermetically sealed. In such a case, the optical waveguide 31 may be a space filled with the air. Meanwhile, condensation may occur when the optical waveguide 31 is hermetically sealed. For this reason, the optical waveguide 31 is preferably not to be hermetically sealed so that a bent hole connecting the optical waveguide 31 and the outside is present.

The optical waveguide 31 that is not hermetically sealed may attract more dust than that is hermetically sealed. For this reason, in order to reduce the optical density, the width of the laser light L1, particularly the width of the collimated light L1a, passing through the optical waveguide 31 preferably is increased to a degree so as not to attract dust. Correspondingly, the width W2 of the optical waveguide 31 has a certain size so that such a collimated light L1a substantially does not hit the inner wall 32. More specifically, the width W2 of the optical waveguide 31 may be 2 mm or greater. With this arrangement, collimated light L1a having a width increased to a degree so as not to attract dust can be allowed to pass through the optical waveguide 31 without reaching the inner wall 32. The width W2 can be, for example, 10 mm or less. Also, as shown in FIG. 1, when the opening of the optical waveguide 31 is covered by the base 13 of the light source unit 1, the width W2 is preferably smaller than the width of the base 13 and greater than the width of the cap 12.

The optical waveguide 31 preferably has a length Le sufficient to substantially prevent transmission of heat between the laser element 11 and the fluorescent material-containing member 21. Also, the length Le is preferably sufficient to allow dissipation of heat of the fluorescent material-containing member 21 and dissipation of heat of the laser element 11 through respectively separate heat sinks. This configuration allows to reduce the size of the heat sink for the fluorescent material-containing member 21, which allows reduction in the space necessary to arrange the wavelength conversion unit 2. More specifically, the length Le is preferably 100 mm or greater. Accordingly, the light source unit 1 and the wavelength conversion unit 2 can be spaced apart from each other as that with the use of an optical fiber. In the specification, the expression "length Le of the optical waveguide 31" refers to a length of the optical waveguide 31 in its extending direction. When the optical waveguide 31 has a bent portion 31c, the length of the extending direction at the center of the optical waveguide 31 is determined as the length Le of the optical waveguide 31. When the inner wall 32 is generally smooth, the length from the first end 31a to the second end 31b may be assumed as the length Le of the optical waveguide 31.

When collimated light L1a has a slight divergence, the longer the optical path of the laser light L1, the greater the possibility that the laser light L1 will hit the inner wall 32. Thus, the longer the optical path of the laser light L1, the greater the influence of deviation from a design value of each member on the laser light L1, and the possibility of the laser light L1 hitting the inner wall 32 increases. Accordingly, the length Le can be, for example, 500 mm or less.

The optical waveguide 31 has a long and narrow shape. That is, the optical waveguide 31 has a length Le that is greater than its width W2. The optical waveguide 31 has a cross-sectional outline of, for example, an approximately circular shape, an approximately elliptic shape, an approximately rectangular shape, or the like. The cross section of the laser light L1 typically has an approximately elliptic shape. Accordingly, the optical waveguide 31 preferably has a cross section of approximately circular shape so that in case of rotational deviation of the laser light L1, the laser light L1 substantially does not hit the inner wall 32. Also, when a portion of the light-shielding member 3 is formed rotatably (FIG. 6, FIG. 9), the optical waveguide 31 preferably has a cross section of an approximately circular shape. With this arrangement, when the tip part 3a is rotated, the laser light L1 can also be directed so as not to hit the inner wall 32. In the present specification, the expression "outline of cross-sectional shape of the optical waveguide 31" refers to a shape of the inner wall 32 in a cross section approximately perpendicular to the extending direction of the optical waveguide 31. The laser light L1 travels in straight path, so that the optical waveguide 31 is preferably in an approximately linear shape except for a bent portion 31c. Thus, arrangement of each member can be facilitated so that the laser light L1 substantially does not hit the inner wall 32 compared to the case where the optical waveguide 31 has a curved portion.

Optical Member 4

Through the optical member 4, the laser light L1 becomes collimated light L1a. As described above, the width of the collimated light L1a is preferably increased to a degree so as not to attract dust. More specifically, it is preferable that the optical member 4 is configured to change the laser light L1 into collimated light L1a having a width of 1 mm or greater. With this, attracting of dust can be reduced. Further, with the width of the collimated light L1a smaller than the width W2 of the optical waveguide 31, a configuration where the collimated light L1a substantially does not hit the inner wall 32 of the light-shielding member 3 can be obtained. In this case, the optical member 4 is arranged so that laser light L1 emitted from the laser element 11 enters the optical member 4 before the width of the laser light L1 reaches to the width W2 of the optical waveguide 31. For the optical member 4, for example, a collimating lens can be used.

In the present specification, the expression "width of collimated light L1a" refers to a greatest width in a direction perpendicular to the propagating direction of the collimated light L1a. In the GaN-based semiconductor laser elements, far field pattern (FFP) of the laser light generally has a greater width in a perpendicular direction than a width in a parallel direction. Accordingly, the expression "a width of collimated light L1a can indicate a beam diameter in perpendicular direction, in other words, a beam diameter in an approximately perpendicular direction with respect to layered surface (i.e., surface perpendicular to the layering direction) of the semiconductor layer of the laser element 11. The beam diameter of the laser light L1 is, for example, determined by a width at a predetermined intensity such as at $1/e^2$ with respect to the peak intensity value. The beam diameter of laser light L1 may also be determined by an aperture diameter. Further, the expression "laser light L1 (or collimated light L1a) substantially does not hit the inner wall 32" refers to a portion of laser light L1 indicated as beam diameter does not hit the inner wall 32.

Figure 10:
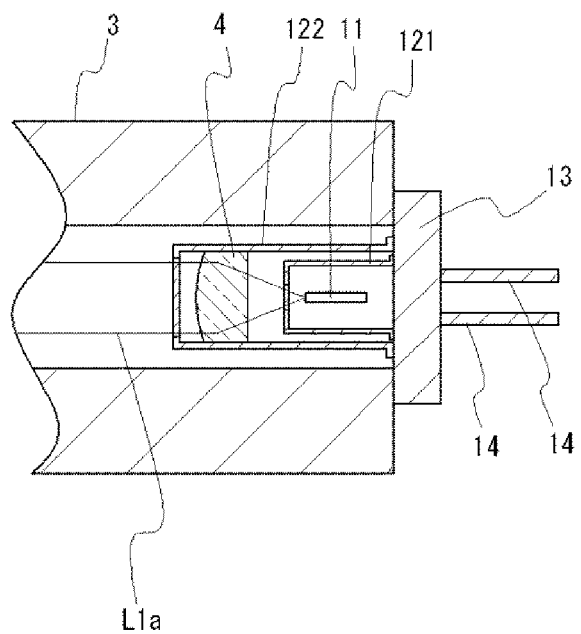
FIG. 10 is a schematic perspective view showing one example of a light source unit.

In the example shown in FIG. 1 etc., the optical member 4 is fixed either directly or via a holding member or the like, to the light-shielding member 3. Alternatively, as shown in FIG. 10, the optical member 4 may be incorporated into the light source unit 1. More specifically, the laser element 11 is sealed by a first cap 121, and the optical member 4 arranged at an outside of the first cap 121 is sealed by a second cap 122. Thus, arranging the optical member 4 in a space sealed by the cap 12 allows for reducing attracting of duct at the surface of the optical member 4. The first cap 121 can be optional.

Collecting Lens 5

As shown in FIG. 1 etc., a collecting lens 5 is preferably arranged at the second end 31b side. With the collecting lens 5, the laser light L1 in a collimated state (collimated light L1a) can be collected to irradiate the fluorescent material-containing member 21. Thus, light of high luminance can be obtained compared to the case in which the collimated light L1a is irradiated on the fluorescent material-containing member 21.

The collecting lens 5 is arranged in the optical path of the collimated light L1a and between the optical member 4 and the fluorescent material-containing member 21. The collecting lens 5 can be fixed to the light-shielding member 3 either directly or via a holding member or the like. As shown in FIG. 1 etc., the second opening at the second end 31b of the optical waveguide 31 is preferably covered by the collecting lens 5. Accordingly, a configuration that hardly allows entering of dust in the optical waveguide 31, so that attracting dust in the optical waveguide 31 can be further reduced.

First Heat Sink 7a, Second Heat Sink 7b

Figure 11:
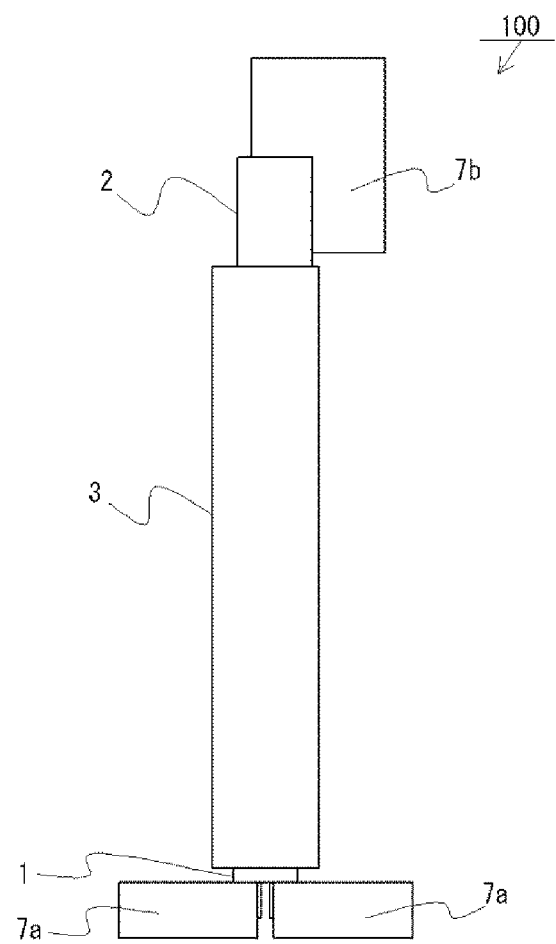
FIG. 11 is a schematic side view illustrating one example of an assembly including a first heat sink and a second heat sink.
Figure 12:
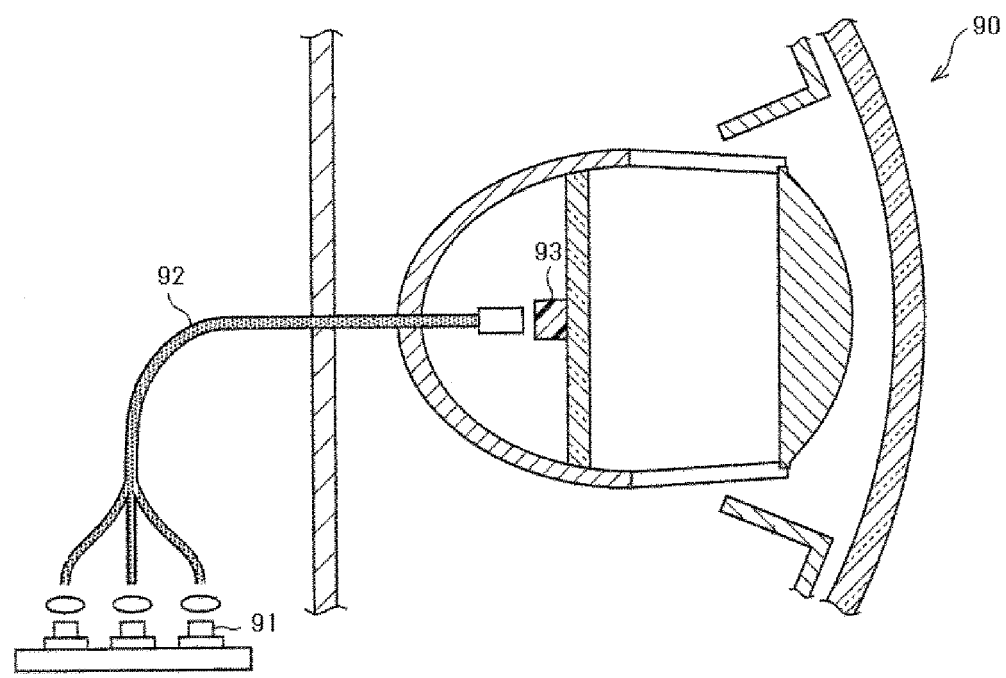
FIG. 12 is a schematic cross-sectional view of a vehicular headlamp according to a related art.

As shown in FIG. 11, the light source device 100 may include a first heat sink 7a and a second heat sink 7b. The first heat sink 7a is arranged at the first end 31a side and is configured to dissipate heat of the laser element 11. The second heat sink 7a is arranged at the second end 31b side and spaced apart from the first heat sink 7a, and is configured to dissipate heat of the fluorescent material-containing member 21. Main heat generating source of the light source device 100 can be the laser element 11 and the fluorescent material-containing member 21. Arranging the laser element 11 and the fluorescent material-containing member 21 spaced apart from each other by the light-shielding member 3 allow for providing the first heat sink 7a and the second heat sink 7b to the laser element 11 and the fluorescent material-containing member 21 respectively. For the first heat sink 7a and the second heat sink 7b, for example, heat-dissipating fins may be used respectively.

When the light-shielding member 3 is not provided and the laser element 11 and the fluorescent material-containing member 21 are arranged too close to each other, so that transmission of heat to each other cannot be substantially prevented, not only the heat of the fluorescent material-containing member 21 but also the heat transmitted from the laser element 11 is required to be dissipated by the heat sink provided close to the fluorescent material-containing member 21. For this reason, in this case, a heat sink having a size larger than that sufficient for dissipating heat of the fluorescent material-containing member 21 is provided for the heat sink for the fluorescent material-containing member 21. However, as shown in FIG. 11, in the light source device 100 having the laser element 11 and the fluorescent material-containing member 21 spaced apart from each other by the light-shielding member 3, transmission of heat from one to the other can be reduced. Accordingly, the heat sink for the fluorescent material-containing member 21 can be of a size sufficient to dissipate the heat of the fluorescent material-containing member 21. The casing 24 of the wavelength conversion unit 2 may be used as a heat sink for the fluorescent material-containing member 21. In this case, for example, a heat-dissipating fin may be provided to release heat of the case 24.

As described above, with the configuration of the light source device 100, quantity of heat to be dissipated by a single heat sink can be reduced, so that the size of the second heat sink 7b for the fluorescent material-containing member 21 can be reduced. Accordingly, space necessary to arrange the wavelength conversion unit 2 can be reduced, so that greater flexibility and diversity in the arrangement of the plurality of light sources can be provided as described above, in vehicular head lamps.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A light source device comprising:
   a light source unit comprising a laser element configured to emit laser light, and a cap hermetically sealing the laser element;
   a wavelength conversion unit comprising a fluorescent material-containing member containing a fluorescent material adapted to be excited by the laser light;
   a light-shielding member having a pipe shape and having a first end with a first opening and a second end with a second opening, wherein the light-shielding member defines a hollow optical waveguide between the first end and the second end, the first opening at the first end is covered by the light source unit, and the wavelength conversion unit is arranged at the second end, thereby allowing the laser light propagating through the hollow optical waveguide to reach the fluorescent material-containing member; and
   an optical member configured to collimate the laser light and direct the collimated laser light to the hollow optical waveguide.

2. The light source device according to claim 1, wherein the hollow optical waveguide has a length of 100 mm or greater.

3. The light source device according to claim 1, wherein the optical member is configured to collimate the laser light into collimated light having a width of 1 mm or greater.

4. The light source device according to claim 3, wherein the hollow optical waveguide has a length of 100 mm or greater.

5. The light source device according to claim 1, wherein the hollow optical waveguide has one or more bent portions, and wherein a mirror configured to direct the laser light along a longitudinal direction of the hollow optical waveguide is disposed each of the one or more bent portions.

6. The light source device according to claim 5, wherein the light-shielding member comprises a tip portion including the second end and a supporting part having the tip portion rotatably attached thereto.

7. The light source device according to claim 5, wherein the hollow optical waveguide has a length of 100 mm or greater.

8. The light source device according to claim 5, wherein the optical member is configured to collimate the laser light into collimated light having a width of 1 mm or greater.

9. The light source device according to claim 8, wherein the hollow optical waveguide has a length of 100 mm or greater.

10. The light source device according to claim 5, further comprising:
    a first heat sink configured to release heat of the light source unit, and
    a second heat sink spaced apart from the first heat sink and configured to release heat of the wavelength conversion unit.

11. The light source device according to claim 1, wherein the light-shielding member comprises a tip portion including the second end and a supporting part having the tip portion rotatably attached thereto.

12. The light source device according to claim 1, further comprising a collecting lens disposed near the second end in the hollow optical waveguide, the collecting lens being configured to collect the collimated laser light and direct the collimated laser light to the fluorescent material-containing member.

13. The light source device according to claim 1, wherein the wavelength conversion unit further comprises a light-reflecting member disposed on a side of the fluorescent material-containing member that is opposite to a side irradiated by the laser light, the light-reflecting member being configured to reflect the laser light and light whose wavelength is converted by the fluorescent material.

14. The light source device according to claim 1, further comprising:
   a first heat sink disposed at the first end and configured to release heat of the laser element; and
   a second heat sink disposed at the second end and spaced apart from the first heat sink, the second heat sink being configured to release heat of the fluorescent material-containing member.

15. The light source device according to claim 1, further comprising:
   a first heat sink configured to release heat of the light source unit, and
   a second heat sink spaced apart from the first heat sink and configured to release heat of the wavelength conversion unit.

16. The light source device according to claim 1, wherein a thickness of a wall of the light-shielding member is 9 mm or less.

17. The light source device according to claim 1, wherein the light-shielding member is primarily made of a metal.

18. The light source device according to claim 12, wherein a thickness of a wall of the light-shielding member is 1 mm or greater.

19. The light source device according to claim 12, wherein a thickness of a wall of the light-shielding member is 9 mm or less.

* * * * *